US012800666B2

(12) United States Patent
Marchais

(10) Patent No.: US 12,800,666 B2
(45) Date of Patent: Nov. 17, 2026

(54) BATTERY MODEL ESTIMATION BASED ON BATTERY TERMINAL VOLTAGE AND CURRENT TRANSIENT DUE TO LOAD POWERED FROM THE BATTERY

(71) Applicant: Cirrus Logic International Semiconductor Ltd., Edinburgh (GB)

(72) Inventor: Emmanuel Marchais, Dripping Springs, TX (US)

(73) Assignee: Cirrus Logic Inc., Austin, TX (US)

( * ) Notice: Subject to any disclaimer, the term of this patent is extended or adjusted under 35 U.S.C. 154(b) by 951 days.

(21) Appl. No.: 17/463,998

(22) Filed: Sep. 1, 2021

(65) Prior Publication Data

US 2022/0137146 A1 May 5, 2022

Related U.S. Application Data

(60) Provisional application No. 63/109,573, filed on Nov. 4, 2020, provisional application No. 63/107,727, filed on Oct. 30, 2020.

(51) Int. Cl.
*G01R 31/382* (2019.01)
*G01R 31/36* (2020.01)
(Continued)

(52) U.S. Cl.
CPC ....... *G01R 31/382* (2019.01); *G01R 31/3648* (2013.01); *G01R 31/367* (2019.01);
(Continued)

(58) Field of Classification Search
CPC ............. G01R 31/382; G01R 31/3648; G01R 31/367; G01R 31/389; G01R 31/392;
(Continued)

(56) References Cited

U.S. PATENT DOCUMENTS 8,415,926 B2 4/2013 Bhardwaj et al.
9,157,968 B1 10/2015 Taylor et al.
(Continued)

FOREIGN PATENT DOCUMENTS

CN 102866357 B * 12/2014
CN 114609525 A 6/2022
(Continued)

OTHER PUBLICATIONS

International Search Report and Written Opinion of the International Searching Authority, International Application No. PCT/US2023/018171, mailed Jul. 31, 2023.
(Continued)

*Primary Examiner* — Shelby A Turner
*Assistant Examiner* — Yaritza H Perez Bermudez
(74) *Attorney, Agent, or Firm* — Jackson Walker L.L.P.

(57) ABSTRACT

A method for estimating parameters of a battery impedance model that models an output impedance of a battery may include dividing the battery impedance model into a plurality of separate impedance stages, wherein each separate impedance stage approximates the battery impedance model within a particular frequency range, the respective impedance in each separate impedance stage comprises a primary impedance model with a primary set of defining impedance parameters and a secondary impedance model with a secondary set of impedance parameters, and the battery impedance model is defined by a series connection of the respective primary impedance models of the plurality of impedance stages. The method may also include monitoring operation of the battery to determine the primary set of defining impedance parameters and the secondary set of impedance parameters.

36 Claims, 5 Drawing Sheets

(51) Int. Cl.
*G01R 31/367* (2019.01)
*G01R 31/389* (2019.01)
*G01R 31/392* (2019.01)
*H02J 7/82* (2026.01)
*H02J 7/84* (2026.01)

(52) U.S. Cl.
CPC ......... *G01R 31/389* (2019.01); *G01R 31/392* (2019.01); *H02J 7/82* (2026.01); *H02J 7/84* (2026.01)

(58) Field of Classification Search
CPC ............. G01R 31/3842; G01R 31/386; G01R 31/385; G01R 31/396; G01R 19/30; G01R 23/16; H02J 7/0048; H02J 7/005; H02J 7/0047
See application file for complete search history.

(56) References Cited

U.S. PATENT DOCUMENTS

| | | | | |
|---|---|---|---|---|
| 10,345,385 | B2 | 7/2019 | Wampler et al. | |
| 11,016,126 | B2 | 5/2021 | Hurwitz | |
| 11,125,707 | B1 | 9/2021 | Fasching et al. | |
| 11,169,213 | B2 | 11/2021 | Karippumannil Prasad et al. | |
| 11,366,169 | B2 | 6/2022 | Ahn | |
| 2004/0006440 | A1* | 1/2004 | Kim | G01R 31/367 702/63 |
| 2005/0156559 | A1 | 7/2005 | Thibedeau et al. | |
| 2007/0035307 | A1 | 2/2007 | Schoch | |
| 2008/0054848 | A1* | 3/2008 | Yun | G01R 31/389 320/134 |
| 2011/0309838 | A1 | 12/2011 | Lin et al. | |
| 2013/0110429 | A1 | 5/2013 | Mitsuyama et al. | |
| 2014/0088897 | A1 | 3/2014 | Sharma et al. | |
| 2014/0244225 | A1 | 8/2014 | Balasingam et al. | |
| 2015/0301116 | A1* | 10/2015 | Baker | G01R 31/367 702/63 |
| 2016/0001672 | A1 | 1/2016 | Lee | |
| 2016/0016482 | A1 | 1/2016 | Lee | |
| 2016/0039419 | A1 | 2/2016 | Wampler et al. | |
| 2016/0077160 | A1* | 3/2016 | Wampler, II | G01R 31/367 702/63 |
| 2018/0095141 | A1* | 4/2018 | Wild | H01M 10/052 |
| 2019/0072618 | A1 | 3/2019 | Ghantous et al. | |
| 2019/0120910 | A1 | 4/2019 | Ghantous et al. | |
| 2020/0182937 | A1* | 6/2020 | Wampler, II | B60L 3/12 |
| 2020/0191876 | A1 | 6/2020 | Shin et al. | |
| 2020/0249281 | A1* | 8/2020 | Ishii | G01R 31/367 |
| 2020/0379049 | A1 | 12/2020 | Gray et al. | |
| 2021/0247451 | A1 | 8/2021 | Hong et al. | |
| 2021/0391741 | A1 | 12/2021 | Rigdon et al. | |
| 2021/0405121 | A1 | 12/2021 | Gill et al. | |
| 2022/0011373 | A1 | 1/2022 | Zappen et al. | |
| 2022/0024438 | A1 | 1/2022 | Vuylsteke et al. | |
| 2022/0074998 | A1 | 3/2022 | Aquilano et al. | |
| 2022/0137143 | A1 | 5/2022 | Melanson et al. | |
| 2023/0031420 | A1 | 2/2023 | Arxberger et al. | |
| 2024/0310449 | A1 | 9/2024 | Duan et al. | |
| 2025/0110179 | A1 | 4/2025 | Bensaad et al. | |
| 2026/0043854 | A1 | 2/2026 | Arroyabe | |

FOREIGN PATENT DOCUMENTS

| | | | | |
|---|---|---|---|---|
| CN | 116736154 | A | 9/2023 | |
| DE | 102016201026 | A1 * | 7/2017 | G01R 31/3842 |
| EP | 2482423 | A1 | 8/2012 | |
| GB | 2598988 | A | 3/2022 | |
| JP | 2005221487 | A | 8/2005 | |
| JP | 2017003349 | A | 1/2017 | |
| WO | 2020097271 | A1 | 5/2020 | |
| WO | 2023212699 | A1 | 11/2023 | |
| WO | 2024081462 | A1 | 4/2024 | |

OTHER PUBLICATIONS

International Search Report and Written Opinion of the International Searching Authority, International Application No. PCT/US2021/052009, mailed Dec. 20, 2021.
International Search Report and Written Opinion of the International Searching Authority, International Application No. PCT/US2023/073001, mailed Dec. 1, 2023.
U.S. Appl. No. 63/606,389, filed Dec. 5, 2023.
Waag, W. et al., "Experimental investigation of the lithium-ion battery impedance characteristic at various conditions and aging states and its influence on the application," Applied Energy, vol. 102, pp. 885-897, 2013.
Barzilai, J. et al., "Two-Point Step Size Gradient Methods," IMA Journal of Numerical Analysis, vol. 8, pp. 141-148, 1988.
Chen, L. et al., "State-of-Charge Estimation of Lithium-Ion Batteries Based on Fractional-Order Square-Root Unscented Kalman Filter," Fractal and Fractional, vol. 6, No. 2, p. 52, 2022.
Liu, C. et al., "State of power estimation of lithium-ion battery based on fractional-order equivalent circuit model," Journal of Energy Storage, vol. 41, 102954, 2021.
Tommasi, L. D. et al., "Single-Input-Single-Output Passive Macromodeling via Positive Fractions Vector Fitting," 12th IEEE Workshop on Signal Propagation on Interconnects, Avignon, France, May 2008.
Raydan, M. et al., "Relaxed steepest descent and Cauchy-Barzilai-Borwein method," Computational Optimization and Applications, vol. 21, No. 2, pp. 155-167, 2002.
Gustavsen, B. et al., "Rational approximation of frequency domain responses by vector fitting," IEEE Trans. on Power Delivery, vol. 14, No. 3, pp. 1052-1061, Jul. 1999.
Sato, K. et al., "Physics-based model of lithium-ion batteries running on a circuit simulator," IEEJ Transactions on Industry Applications, vol. 139, No. 5, pp. 523-534, 2019.
Ren, B. et al., "Parameter identification of a lithium-ion battery based on the improved recursive least square algorithm," IET Power Electronics, vol. 13, No. 12, pp. 2531-2537, Sep. 2020.
Hahn, M. et al., "Optimized Process Parameters for a Reproducible Distribution of Relaxation Times Analysis of Electrochemical Systems," Batteries, vol. 5, No. 2, 43, 2019.
Malenovsky, V. et al., "Optimal Step-Size LMS Algorithm Using Exponentially Averaged Gradient Vector," EUROCON 2005, pp. 1554-1557, Nov. 2005.
Zhang, C. et al., "Online estimation of battery equivalent circuit model parameters and state of charge using decoupled least squares technique," Energy, vol. 142, pp. 678-688, 2018.
Mclernon, D. C. et al., "On the convergence of the LMS algorithm with a rank-deficient input autocorrelation matrix," Signal Processing, vol. 89, pp. 2244-2250, 2009.
Tang, X. et al., "Li-ion Battery Parameter Estimation for State of Charge," Proceedings of the 2011 American Control Conference, San Francisco, California, Jun. 2011.
Gunasekar, S. et al., "Implicit Regularization in Matrix Factorization," 2018 Information Theory and Applications Workshop (ITA), Feb. 2018.
Buller, S. et al., "Impedance-Based Simulation Models of Supercapacitors and Li-Ion Batteries for Power Electronic Applications," IEEE Transactions on Industry Applications, vol. 41, No. 3, May-Jun. 2005.
Elwakil, A. S. , "Fractional-order circuits and systems: An emerging interdisciplinary research area," IEEE Circuits and Systems Magazine, vol. 10, No. 4, pp. 40-50, Nov. 2010.
Boukamp, B. A., "A Linear Kronig-Kramers Transform Test for Immittance Data Validation," J. Electrochem. Soc., vol. 142, No. 6, pp. 1885-1894, Jun. 1995.
Boukamp, B. A., "Distribution (function) of relaxation times, successor to complex nonlinear least squares analysis of electrochemical impedance spectroscopy?", J. Phys. Energy, vol. 2, 2020.
O'Leary, D. P., "Confidence Intervals for Inequality-Constrained Least Squares Problems, with Applications to III-Posed Problems," SIAM Journal on Scientific and Statistical Computing, vol. 7, No. 2, pp. 473-489, Apr. 1986.

(56) References Cited

OTHER PUBLICATIONS

Livesey, A. K. et al., "Analyzing the Distribution of Decay Constants in Pulse-Fluorimetry Using the Maximum Entropy Method," Biophysical Journal, vol. 52, No. 5, pp. 693-706, Nov. 1987.
Kong, X. et al., "An Exact Closed-Form Impedance Model for Porous-Electrode Lithium-Ion Cells," J. Electrochem. Soc., vol. 167, 2020.
Ye, J. et al., "An Adaptive Peak Power Prediction Method for Power Lithium-Ion Batteries Considering Temperature and Aging Effects," Processes, vol. 11, No. 8, p. 2449, 2023.
Shynk, J. J., "Adaptive IIR Filtering," IEEE ASSP Magazine, vol. 6, No. 2, pp. 4-21, Apr. 1998.
Sayed, A. H. et al., "A Survey of Spectral Factorization Methods," Numer. Linear Algebra Appl., vol. 8, pp. 467-496, 2001.
Rodriguez-Iturriaga, P. et al., "A physics-based fractional-order equivalent circuit model for time and frequency-domain applications in lithium-ion batteries," J. Energy Storage, vol. 64, 2023.
Agudelo, B. O. et al., "A Comparison of Time-Domain Implementation Methods for Fractional-Order Battery Impedance Models," Energies, vol. 14, No. 15, 4415, 2021.
Lopez-Villanueva, Juan A. et al., A Compact Model of the ZARC for Circuit Simulators in the Frequency and Time Domains, Int. J. Electron. Commun. 153 (2022).
U.S. Appl. No. 63/605,003, filed Dec. 1, 2023.
U.S. Appl. No. 63/605,031, filed Dec. 1, 2023.
U.S. Appl. No. 63/606,179, filed Dec. 5, 2023.
Combined Search and Examination Report under Sections 17 and 18(3), UKIPO, Application No. GB2416377.6, mailed May 2, 2025.
Combined Search and Examination Report under Sections 17 and 18(3), UKIPO, Application No. GB2416607.6, mailed May 16, 2025.
Zhang et al., A novel fractional variable-order equivalent circuit model and parameter identification of electric vehicle Li-ion batteries, ISA Transactions 97 (2020), 448-457.

* cited by examiner

BATTERY MODEL ESTIMATION BASED ON BATTERY TERMINAL VOLTAGE AND CURRENT TRANSIENT DUE TO LOAD POWERED FROM THE BATTERY

RELATED APPLICATION

The present disclosure claims priority to U.S. Provisional Patent Application Ser. No. 63/107,727, filed Oct. 30, 2020, and to U.S. Provisional Patent Application Ser. No. 63/109,573, filed Nov. 4, 2020, both of which are incorporated by reference herein in their entireties.

FIELD OF DISCLOSURE

The present disclosure relates in general to circuits for electronic devices, including without limitation personal portable devices such as wireless telephones and media players, and more specifically, to battery model estimation for a battery which may be used to power components of an electronic device.

BACKGROUND

Portable electronic devices, including wireless telephones, such as mobile/cellular telephones, tablets, cordless telephones, mp3 players, and other consumer devices, are in widespread use. Such a portable electronic device may include a battery (e.g., a lithium-ion battery) for powering components of the portable electronic device.

In operation, the terminal voltage of a battery may droop under a load current due to internal output impedance of the battery. Such output impedance may be modeled in a number of suitable manners, including with an equivalent circuit model of a series of parallel-coupled resistors and capacitors. Knowledge of the detailed impedance of a battery may be useful for fuel-gauging algorithms (e.g., for determining a battery open-circuit voltage and state of charge, predicting power limits, and/or deriving safety limits or safe operation limits of the battery (e.g., a maximum voltage and maximum current of the battery terminal)).

Using traditional approaches, an impedance model is typically estimated using a low-level sinusoidal test current or short-term impulse. However, such approaches may impose loading conditions on the battery which are different from real-use-case conditions of a mobile device, which may lead to an inadequate model.

In addition, using traditional approaches, estimation of a battery impedance model having a multi-order complex impedance is computationally expensive.

SUMMARY

In accordance with the teachings of the present disclosure, one or more disadvantages and problems associated with existing approaches to modeling battery impedance may be reduced or eliminated.

In accordance with embodiments of the present disclosure, a method of management of a battery that powers a component of a device may include monitoring a terminal voltage and a terminal current of the battery under a load that is drawing a current from the battery to provide power to a component of the device and modeling the battery as a battery model that approximates a relationship between the monitored terminal voltage and terminal current over at least one of: a certain frequency range, a certain duration, a certain amplitude range, an applied load, a set of conditions of the battery, and a set of conditions of the load. The relationship between the terminal voltage and the terminal current may have a frequency-dependent characteristic including at least two time constants. The two time constants may represent a time-varying relationship between an input and output of the battery model.

In accordance with these and other embodiments of the present disclosure, a system for management of a battery that powers a component of a device may include battery monitoring circuitry configured to monitor a terminal voltage and a terminal current of the battery under a load that is drawing a current from the battery to provide power to a component of the device and a battery model estimator configured to model the battery as a battery model that approximates a relationship between the monitored terminal voltage and terminal current over at least one of: a certain frequency range, a certain duration, a certain amplitude range, an applied load, a set of conditions of the battery, and a set of conditions of the load. The relationship between the terminal voltage and the terminal current may have a frequency-dependent characteristic including at least two time constants. The two time constants may represent a time-varying relationship between an input and output of the battery model.

In accordance with these and other embodiments of the present disclosure, a method for estimating parameters of a battery impedance model that models an output impedance of a battery may include dividing the battery impedance model into a plurality of separate impedance stages, wherein each separate impedance stage approximates the battery impedance model within a particular frequency range, the respective impedance in each separate impedance stage comprises a primary impedance model with a primary set of defining impedance parameters and a secondary impedance model with a secondary set of impedance parameters, and the battery impedance model is defined by a series connection of the respective primary impedance models of the plurality of impedance stages. The method may also include monitoring operation of the battery to determine the primary set of defining impedance parameters and the secondary set of impedance parameters.

In accordance with these and other embodiments of the present disclosure, a system for estimating parameters of a battery impedance model that models an output impedance of a battery may include one or more inputs configured to receive information regarding operation of the battery and battery monitoring circuitry. The battery monitoring circuitry may be configured to divide the battery impedance model into a plurality of separate impedance stages, wherein each separate impedance stage approximates the battery impedance model within a particular frequency range, the respective impedance in each separate impedance stage comprises a primary impedance model with a primary set of defining impedance parameters and a secondary impedance model with a secondary set of impedance parameters, and the battery impedance model is defined by a series connection of the respective primary impedance models of the plurality of impedance stages, The battery monitoring circuitry may also be configured to monitor operation of the battery to determine the primary set of defining impedance parameters and the secondary set of impedance parameters.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
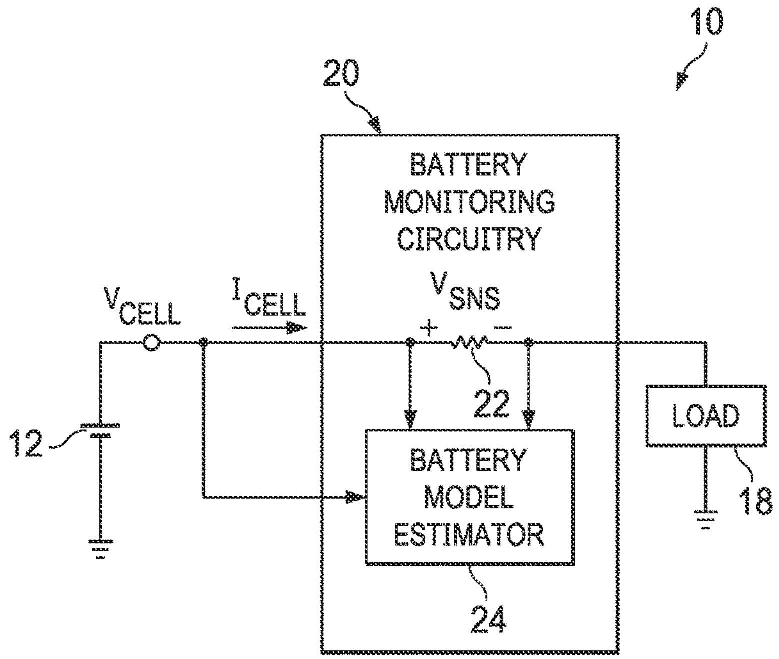
FIG. 1 illustrates a block diagram of selected components of an example power delivery network, in accordance with embodiments of the present disclosure.

FIG. 1 illustrates a block diagram of selected components of an example power delivery network 10, in accordance with embodiments of the present disclosure. In some embodiments, power delivery network 10 may be implemented within a portable electronic device, such as a smart phone, tablet, game controller, and/or other suitable device.

As shown in FIG. 1, power delivery network 10 may include a battery 12 and a load 18. As shown in FIG. 1, when loaded by load 18, battery 12 may generate a battery voltage $V_{CELL}$ across its terminals and deliver a battery current $I_{CELL}$ to load 18. In some embodiments, battery 12 may comprise a lithium-ion battery. Load 18 may represent any electric component, electronic component, and/or combination thereof. For example, load 18 may include any suitable functional circuits or devices of power delivery network 10, including without limitation power converters, processors, audio coder/decoders, amplifiers, display devices, etc. Further, although not explicitly shown in FIG. 1, power delivery network 10 may also include control circuitry for controlling operation of battery 12 and/or load 18.

As also shown in FIG. 1, power delivery network 10 may include battery monitoring circuitry 20. Battery monitoring circuitry 20 may include any suitable system, device, or apparatus configured to monitor battery voltage $V_{CELL}$ and battery current $I_{CELL}$. Further, battery monitoring circuitry 20 may include a battery model estimator 24 configured to monitor battery voltage $V_{CELL}$ and a sense voltage $V_{SNS}$ across a sense resistor 22 indicative of battery current $I_{CELL}$, and based thereon, estimate a battery impedance model for battery 12, as described in greater detail below. Battery model estimator 24 may be implemented with a processing device, including without limitation a microprocessor, digital signal processor, application-specific integrated circuit, field-programmable gate array, electrically-erasable programmable read only memory, complex programmable logic device, and/or other suitable processing device. In some embodiments, battery monitoring circuitry 20 may monitor a temperature associated with battery 12, and battery model estimator 24 may estimate the impedance model based on battery voltage $V_{CELL}$, a sense voltage $V_{SNS}$, and the sensed temperature.

Figure 2:
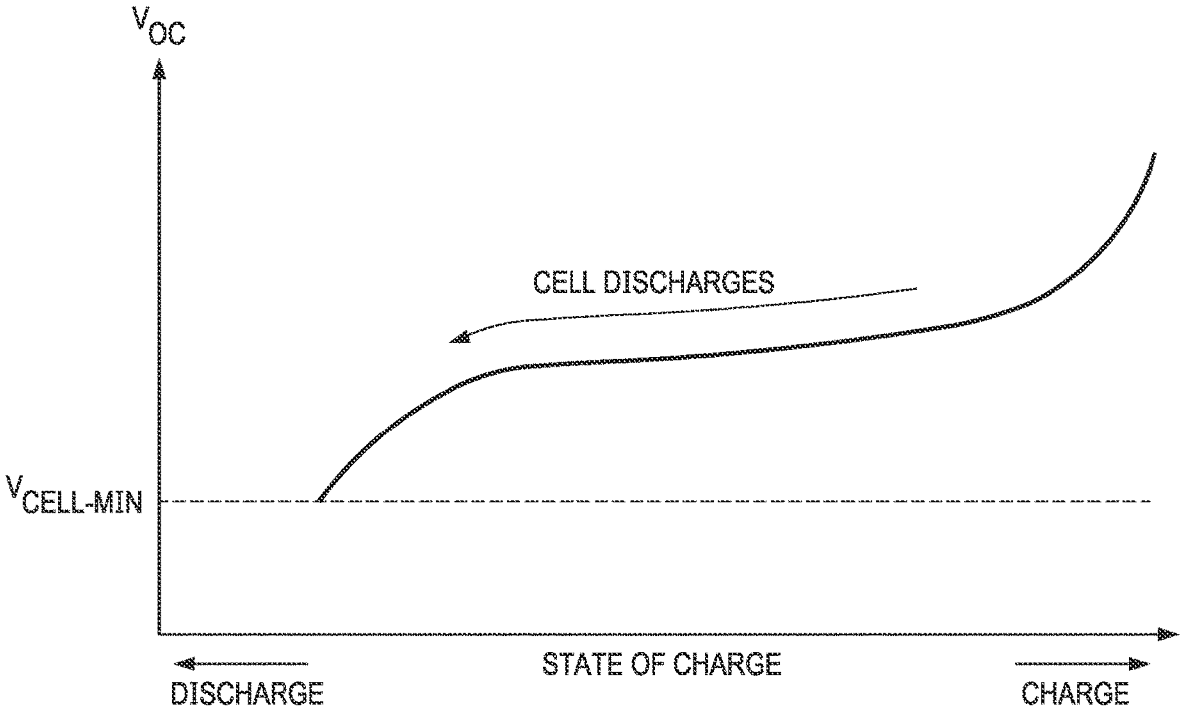
FIG. 2 illustrates an example graph of an open circuit voltage of a battery versus the battery's state of charge, in accordance with embodiments of the present disclosure.

Lithium-ion batteries are typically known to operate from 4.5 V down to 3.0 V, known as an open circuit voltage $V_{OC}$ of the battery (e.g., battery 12). As a battery discharges due to a current drawn from the battery, the state of charge of the battery may also decrease, and open circuit voltage $V_{OC}$ (which may be a function of state of charge) may also decrease as a result of electrochemical reactions taking place within the battery, as shown in FIG. 2. Outside the range of 3.0 V and 4.5 V for open circuit voltage $V_{OC}$, the capacity, life, and safety of a lithium-ion battery may degrade. For example, at approximately 3.0 V, approximately 95% of the energy in a lithium-ion cell may be spent (i.e., state of charge is 5%), and open circuit voltage $V_{OC}$ would be liable to drop rapidly if further discharge were to continue. Below approximately 2.4 V, metal plates of a lithium-ion battery may erode, which may cause higher internal impedance for the battery, lower capacity, and potential short circuit. Thus, to protect a battery (e.g., battery 12) from over-discharging, many portable electronic devices may prevent operation below a predetermined end-of-discharge voltage. Knowledge of the output impedance may be useful in determining open circuit voltage $V_{OC}$ and other parameters of battery 12.

Figure 3:
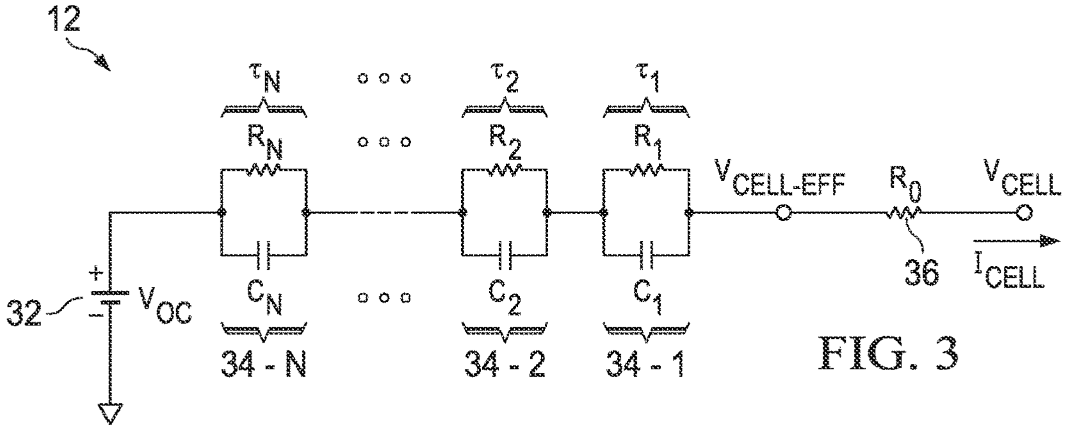
FIG. 3 illustrates a circuit diagram of selected components of an equivalent circuit model for a battery, in accordance with embodiments of the present disclosure.

FIG. 3 illustrates a block diagram of selected components of an equivalent circuit model for battery 12, in accordance with embodiments of the present disclosure. As shown in FIG. 3, battery 12 may be modeled as having a battery cell 32 having an open circuit voltage $V_{OC}$ in series with a plurality of parallel resistive-capacitive sections 34 (e.g., parallel resistive-capacitive sections 34-1, 34-2, . . . , 34-N) and further in series with an equivalent series resistance 36 of battery 12, such equivalent series resistance 36 having a resistance of $R_0$. Resistances $R_1$, $R_2$, . . . $R_N$, and respective capacitances $C_1$, $C_2$, . . . , $C_N$ may model battery chemistry-dependent time constants $\tau_1$, $\tau_2$, . . . , $\tau_N$, that may be lumped with open circuit voltage $V_{OC}$ and equivalent series resistance 36. The series of impedance sections represented by resistive-capacitive sections 34 and equivalent series resistance 36 may represent diffusion processes that occur at different rates inside battery 12. Cutoff frequencies of parallel resistive-capacitive sections 34 may respectively be given by:

$$f_{c1} = \frac{1}{\tau_1} = \frac{1}{2\pi R_1 C_1};$$
$$f_{c2} = \frac{1}{\tau_2} = \frac{1}{2\pi R_2 C_2};$$
$$\ldots$$
$$f_{cN} = \frac{1}{\tau_3} = \frac{1}{2\pi R_N C_N};$$

wherein π represents the well-known mathematical constant defined as the ratio of a circle's circumference to its diameter, and wherein parallel resistive-capacitive sections 34 are ordered such that $f_{cN} < \ldots < f_{c2} < f_{c1}$.

Notably, an electrical node depicted with voltage $V_{CELL-EFF}$ in FIG. 3 may capture the time varying discharge behavior of battery 12, and battery voltage $V_{CELL}$ may be an actual voltage seen across the output terminals of battery 12. Voltage $V_{CELL-EFF}$ may not be directly measurable, and thus battery voltage $V_{CELL}$ may be the only voltage associated with battery 12 that may be measured to evaluate battery state of health. Also of note, at a current draw of zero (e.g., $I_{CELL}=0$), battery voltage $V_{CELL}$ may be equal to voltage $V_{CELL-EFF}$ which may in turn be equal to an open circuit voltage $V_{OC}$ at a given state of charge.

To estimate an impedance model of battery 12, battery model estimator 24 may divide the output impedance of battery 12 into a number of stages, thus breaking down the estimation problem into several identification problems of lower order. Such estimation in stages may be possible due to the fact that cutoff frequencies (or time constants) of the diffusion processes represented by the various parallel resistive-capacitive sections 34 may be separated by an order of magnitude or more.

Figure 4:
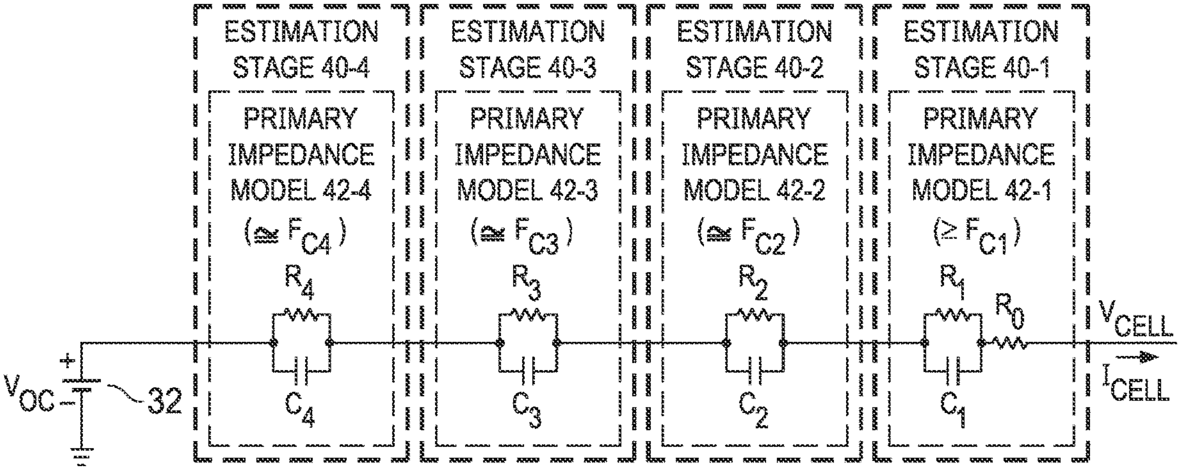
FIG. 4 illustrates a circuit diagram of selected components of an equivalent circuit model for a battery depicting estimation of a battery impedance model in stages, in accordance with embodiments of the present disclosure.

Although an impedance model of battery 12 may include any number N of stages as shown in FIG. 3, battery model estimator 24 may estimate an impedance model using any suitable number of stages and performing an estimation for each individual stage. For example, in some embodiments, battery model estimator 24 may estimate the impedance model of battery 12 in four estimation stages 40-1, 40-2, 40-3, and 40-4, as shown in FIG. 4. Estimation stage 40-1 may estimate resistance $R_0$, resistance $R_1$, and capacitance $C_1$, estimation stage 40-2 may estimate resistance $R_2$ and capacitance $C_2$, estimation stage 40-3 may estimate resistance $R_3$ and capacitance $C_3$, and estimation stage 40-4 may estimate resistance $R_4$ and capacitance $C_4$.

In operation, battery model estimator 24 may estimate the full battery impedance model as the sum of respective primary impedance models 42 (e.g., primary impedance models 42-1, 42-2, 42-3, and 42-4) for each of estimation stages 40. A primary impedance model 42 for a particular estimation stage 40 may define a main feature of the full battery impedance model within a frequency band $FB_M$ centered around the cutoff frequency (e.g., $f_{c1}$ $f_{c2}$, $f_{c3}$, $f_{c4}$) associated with the primary impedance of such estimation stage 40. For instance, if a primary impedance model 42-M of an estimation stage 40-M has a single cutoff frequency defined by resistance $R_M$ in parallel with capacitance $C_M$, then a frequency $f_{cM}$ may be the cutoff frequency of such primary impedance model 42-M.

However, a primary impedance of an estimation stage 40-M may not be directly identified from characteristics of battery voltage $V_{CELL}$ and battery current $I_{CELL}$ in frequency band $FB_M$, because the primary impedances of other estimation stages 40 may contribute to the frequency response of the full battery impedance model within frequency band $FB_M$. Accordingly, battery model estimator 24 may estimate the impedance model for each estimation stage 40-M using a secondary impedance model for such estimation stage 40-M, such secondary impedance model modelling the residual impedance of the neighboring preceding estimation stages (e.g., estimation stages 40-1 to 40[M−1]) and subsequent estimation stages (e.g., estimation stages 40[M+1] to 40-N) over the frequency band $FB_M$ for such estimation stage 40-M. For example, for estimation stage 40-1, the subsequent estimation stages 40-2, 40-3, and 40-4 with primary impedance models $R_2||C_2$, $R_3||C_3$, $R_4||C_4$, have a residual impedance within frequency band $FB_1$ associated with estimation stage 40-1, which may be modeled with a lumped secondary impedance model 44-1 $R_2||C_2$, as shown in FIG. 5.

Figure 5:
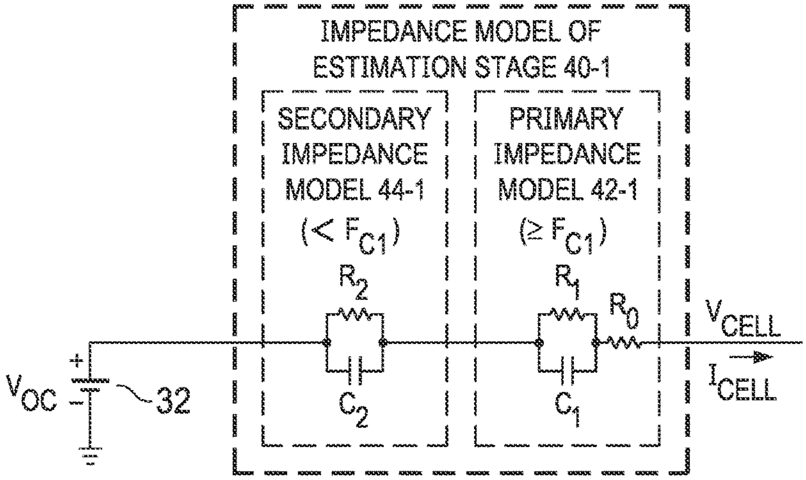
FIG. 5 illustrates a circuit diagram of selected components of an equivalent impedance model for a first estimation stage, in accordance with embodiments of the present disclosure.

As depicted in FIG. 5, an impedance model for estimate stage 40-1 may include a primary impedance model 42-1 with impedance $R_0+R_1||C_1$ having primary parameters $R_0$, $R_1$, and $C_1$ modeling the effects of impedance near and above cutoff frequency $f_{c1}$. Primary impedance model 42-1 may be in series with secondary impedance model 44-1 with impedance $R_2||C_2$ and having secondary parameters $R_2$ and $C_2$ modeling the effects of residual impedance of neighboring estimation stages 40 near cutoff frequency $f_{c1}$.

In operation, battery model estimator 24 may filter measurements of battery voltage $V_{CELL}$ and battery current $I_{CELL}$ with a bandpass filter centered around cutoff frequency $f_{c1}$, or alternatively highpass filter such measurements with a high-pass filter having a cutoff frequency above cutoff frequency $f_{c2}$ but below cutoff frequency $f_{c1}$. Further, battery model estimator 24 may use a least-squares method or other appropriate fit approach in order to fit primary parameters $R_0$, $R_1$, and $C_1$ and secondary parameters $R_2$ and $C_2$ to the filtered battery voltage $V_{CELL}$ and battery current $I_{CELL}$ sequence.

Battery model estimator 24 may perform two estimation steps to estimate such parameters. In a first estimation step (e.g., as described with reference to FIG. 10A, below), a least-squares method may estimate both primary parameters $R_0$, $R_1$, and $C_1$ and secondary parameters $R_2$ and $C_2$ simultaneously. In a second estimation step (e.g., as described with reference to FIG. 10B, below), battery model estimator 24 may set secondary parameters $R_2$ and $C_2$ of the residual impedance by subsequent estimates of the primary impedance in the neighboring estimation stages 40, and may only least-squares fit primary impedance parameters $R_0$, $R_1$, and $C_1$ of estimation stage 40-1 during the second estimation step. Such second estimation step may iteratively improve accuracy of the fitted parameters. Thus, in this example, battery model estimator 24 may set secondary parameters $R_2$ and $C_2$ of estimation stage 40-1 from an estimation of the primary parameters $R_2$ and $C_2$ of estimation stage 40-2.

Figure 6:
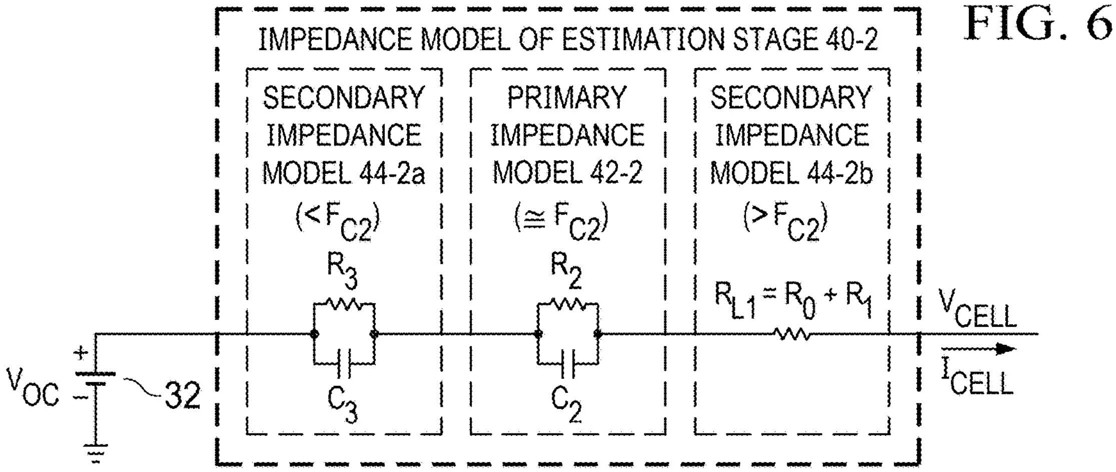
FIG. 6 illustrates a circuit diagram of selected components of an equivalent impedance model for a second estimation stage, in accordance with embodiments of the present disclosure.

As depicted in FIG. 6, an impedance model for estimate stage 40-2 may include a primary impedance model 42-2 with impedance $R_2||C_2$ having primary parameters $R_2$ and $C_2$ modeling the effects of impedance near cutoff frequency $f_{c2}$. Primary impedance model 42-2 may be in series with secondary impedance model 44-2*a* with impedance $R_3||C_3$ having secondary parameters $R_3$ and $C_3$ and with another secondary impedance model 44-2*b* with impedance $R_{L1}=R_0+R_1$, wherein secondary parameters $R_{L1}$, $R_3$, and $C_3$ model the effects of residual impedance of neighboring estimation stages 40 near cutoff frequency $f_{c2}$.

In operation, battery model estimator 24 may filter measurements of battery voltage $V_{CELL}$ and battery current $I_{CELL}$ with a bandpass filter centered around cutoff frequency $f_{c2}$, or alternatively highpass filter such measurements with a high-pass filter having a cutoff frequency above cutoff frequency $f_{c3}$ but below cutoff frequency $f_{c2}$. Further, battery model estimator 24 may use a least-squares method or other appropriate fit approach in order to fit primary parameters $R_2$ and $C_2$ and secondary parameters $R_{L1}$, $R_3$, and $C_3$ to the filtered battery voltage $V_{CELL}$ and battery current $I_{CELL}$ sequence.

Battery model estimator 24 may perform two estimation steps to estimate such parameters. In a first estimation step (e.g., as described with reference to FIG. 10A, below), a least-squares method may estimate both primary parameters $R_2$ and $C_2$ and secondary parameters $R_{L1}$, $R_3$, and $C_3$ simultaneously. In the second estimation step (e.g., as described with reference to FIG. 10B, below), battery model estimator 24 may set secondary parameters $R_{L1}$, $R_3$, and $C_3$ of the residual impedance by subsequent estimates of the primary impedance in the neighboring estimation stages 40, and may only least-squares fit primary impedance parameters $R_2$ and $C_2$ of estimation stage 40-2 during the second estimation step. Such second estimation step may iteratively improve accuracy of the fitted parameters. Thus, in this example, battery model estimator 24 may set secondary parameters $R_2$ and $C_2$ of estimation stage 40-2 from an estimation of the primary parameters $R_3$ and $C_3$ of estimation stage 40-3 and from an estimation of the primary parameters $R_0$ and $R_1$ of estimation stage 40-1.

Figure 7:
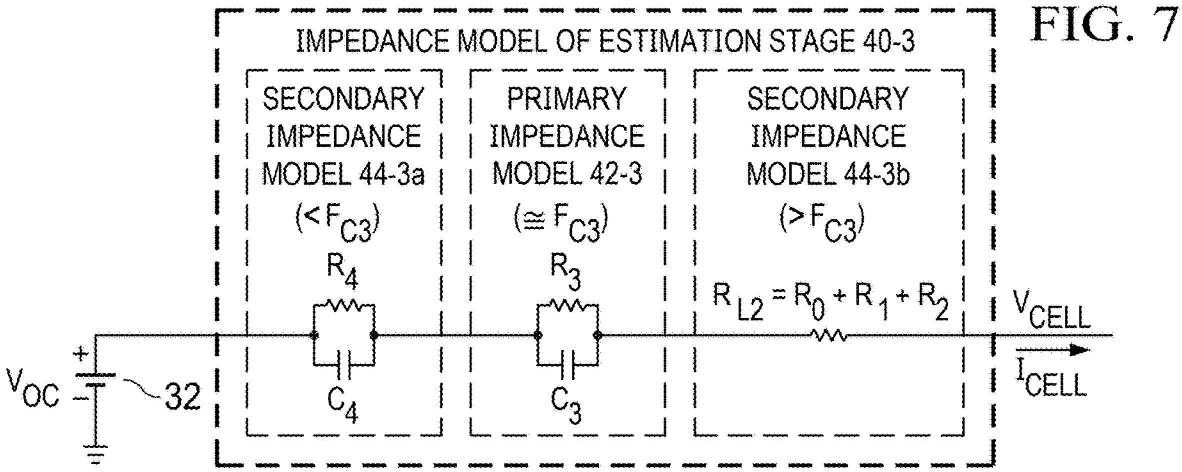
FIG. 7 illustrates a circuit diagram of selected components of an equivalent impedance model for a third estimation stage, in accordance with embodiments of the present disclosure.

As depicted in FIG. 7, an impedance model for estimation stage 40-3 may include a primary impedance model 42-3 with impedance $R_3||C_3$ having primary parameters $R_3$ and $C_3$ modeling the effects of impedance near cutoff frequency $f_{c3}$. Primary impedance model 42-3 may be in series with secondary impedance model **44-3*a* with impedance $R_4||C_4$ having secondary parameters $R_4$ and $C_4$ and with another secondary impedance model 44-3*b* with impedance $R_{L2}=R_0+R_1+R_2$, wherein secondary parameters $R_{L2}$, $R_4$, and $C_4$ model the effects of residual impedance of neighboring estimation stages 40** near cutoff frequency $f_{c3}$.

In operation, battery model estimator 24 may filter measurements of battery voltage $V_{CELL}$ and battery current $I_{CELL}$ with a bandpass filter centered around cutoff frequency $f_{c3}$, or alternatively highpass filter such measurements with a high-pass filter having a cutoff frequency above cutoff frequency $f_{c4}$ but below cutoff frequency $f_{c3}$. Further, battery model estimator 24 may use a least-squares method or other appropriate fit approach in order to fit primary parameters $R_3$ and $C_3$ and secondary parameters $R_{L2}$, $R_4$, and $C_4$ to the filtered battery voltage $V_{CELL}$ and battery current $I_{CELL}$ sequence.

Battery model estimator 24 may perform two estimation steps to estimate such parameters. In a first estimation step (e.g., as described with reference to FIG. 10A, below), a least-squares method may estimate both primary parameters $R_3$ and $C_3$ and secondary parameters $R_{L2}$, $R_4$, and $C_4$ simultaneously. In the second estimation step (e.g., as described with reference to FIG. 10B, below), battery model estimator 24 may set secondary parameters $R_{L2}$, $R_4$, and $C_4$ of the residual impedance by subsequent estimates of the primary impedance in the neighboring estimation stages 40, and may only least-squares fit primary impedance parameters $R_3$ and $C_3$ of estimation stage 40-3 during the second estimation step. Such second estimation step may iteratively improve accuracy of the fitted parameters. Thus, in this example, battery model estimator 24 may set secondary parameters $R_3$ and $C_3$ of estimation stage 40-3 from an estimation of the primary parameters $R_4$ and $C_4$ of estimation stage 40-4 and from an estimation of the primary parameters $R_0$, $R_1$, and $R_2$ of estimation stages 40-1 and 40-2.

Figure 8:
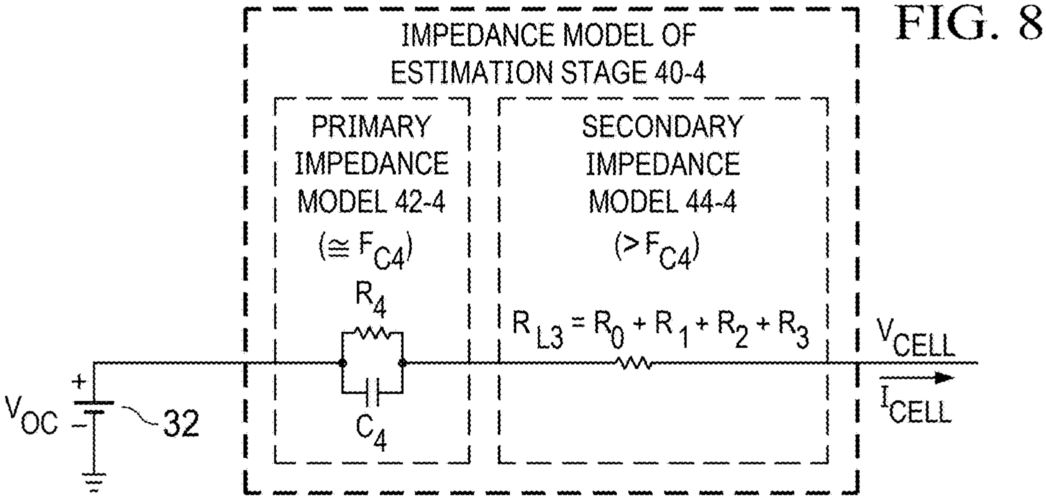
FIG. 8 illustrates a circuit diagram of selected components of an equivalent impedance model for a fourth estimation stage, in accordance with embodiments of the present disclosure.

As depicted in FIG. 8, an impedance model for estimate stage 40-4 may include a primary impedance model 42-4 with impedance $R_4||C_4$ having primary parameters $R_4$ and $C_4$ modeling the effects of impedance near cutoff frequency $f_{c4}$. Primary impedance model 42-4 may be in series with secondary impedance model 44-4 with impedance $R_{L3}=R_0+R_1+R_2+R_3$, wherein secondary parameter $R_{L3}$ models the effects of residual impedance of neighboring estimation stages 40 near cutoff frequency $f_{c4}$.

In operation, battery model estimator 24 may filter measurements of battery voltage $V_{CELL}$ and battery current $I_{CELL}$ with a bandpass filter centered around cutoff frequency $f_{c4}$. Further, battery model estimator 24 may use a least-squares method or other appropriate fit approach in order to fit primary parameters $R_4$ and $C_4$ and secondary parameter $R_{L3}$ to the filtered battery voltage $V_{CELL}$ and battery current $I_{CELL}$ sequence.

Battery model estimator 24 may perform two estimation steps to estimate such parameters. In a first estimation step (e.g., as described with reference to FIG. 10A, below), a least-squares method may estimate both primary parameters $R_4$ and $C_4$ and secondary parameter $R_{L3}$ simultaneously. In the second estimation step (e.g., as described with reference to FIG. 10B, below), battery model estimator 24 may set secondary parameter $R_{L3}$ of the residual impedance by subsequent estimates of the primary impedance in the neighboring estimation stages 40, and may only least-squares fit primary impedance parameters $R_4$ and $C_4$ of estimation stage 40-3 during the second estimation step. Such second estimation step may iteratively improve accuracy of the fitted parameters. Thus, in this example, battery model estimator 24 may set secondary parameters $R_4$ and $C_4$ of estimation stage 40-4 from an estimation of the primary parameters $R_0$, $R_1$, $R_2$, and $R_3$ of estimation stages 40-1, 40-2, and 40-3.

The first estimation step for each estimation stage 40 may only be needed once when no a priori estimate of secondary parameters is defined. Once the primary parameters of every estimation stage 40 have been estimated via this first estimation step, battery model estimator 24 may pass on the primary parameters as secondary parameters of neighboring estimation stages 40 to simplify and constrain the estimation process, as well as potentially leading to iteratively more accurate estimates of the full battery impedance model.

Once the full model parameters are estimated, battery model estimator 24 may estimate open circuit voltage $V_{OC}$, voltage $V_{CELL\text{-}EFF}$, internal overpotential states of battery 12, a lithium-ion anode potential, and/or other state representing a condition of the battery that may lead to degradation of its chemistry, by monitoring current $I_{CELL}$ (e.g., which may be indicated by sense voltage $V_{SNS}$). Battery model estimator 24 may estimate such overpotential states with a simple filter model or with a Kalman filter, for example.

Figure 9:
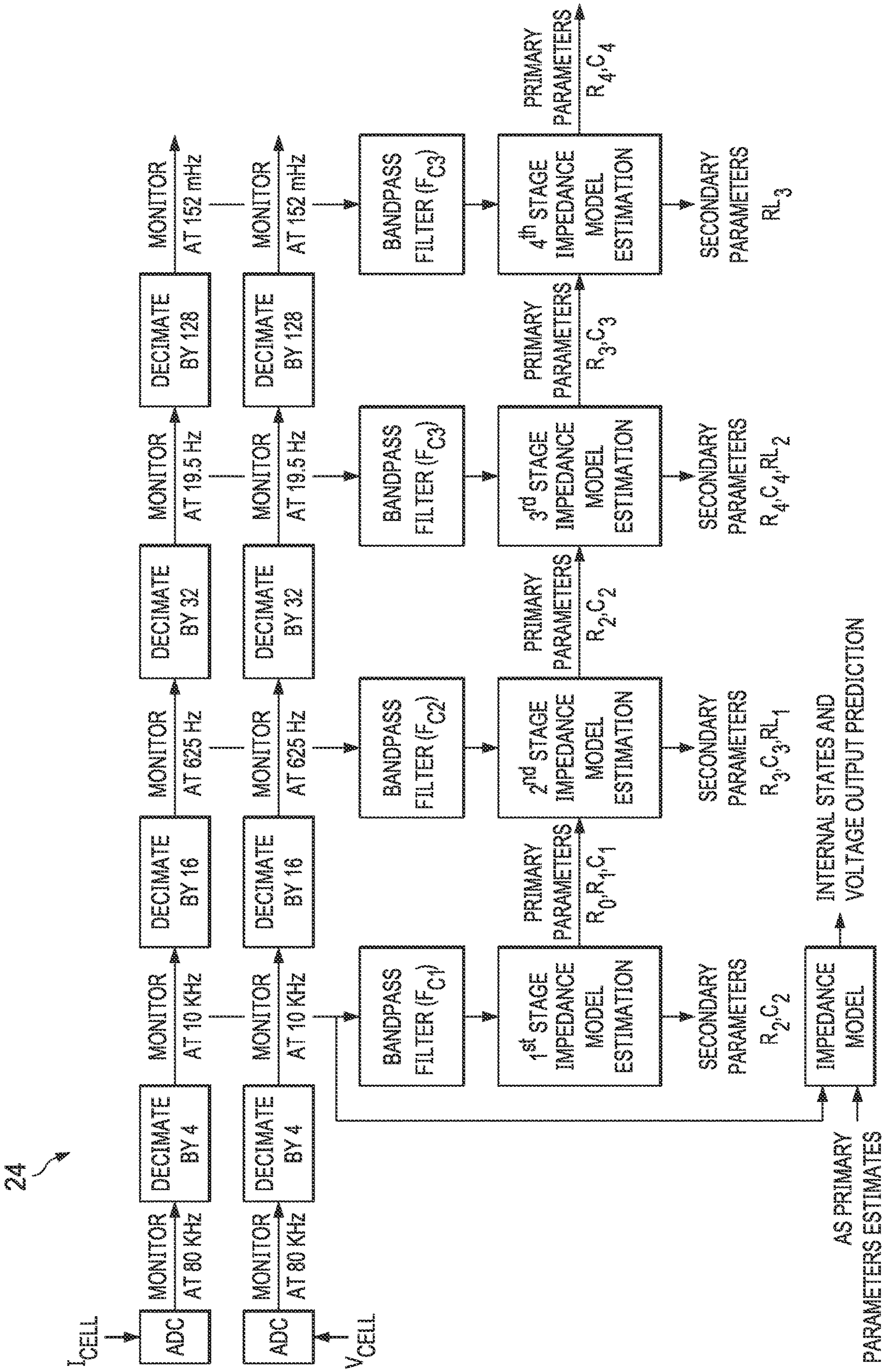
FIG. 9 illustrates a block diagram of selected components of a battery model estimator, in accordance with embodiments of the present disclosure.

FIG. 9 illustrates a block diagram of selected components of battery model estimator 24, in accordance with embodiments of the present disclosure. As shown in FIG. 9, battery model estimator 24 may sample battery voltage $V_{CELL}$ and battery current $I_{CELL}$ with analog-to-digital converters (ADCs), and battery model estimator 24 may decimate such sampled battery voltage $V_{CELL}$ and battery current $I_{CELL}$ for each estimation stage 40 to a lower rate sufficient to obtain a suitable estimation. Such signal decimation may reduce an amount of processing required in estimating the battery impedance model while still maintaining desirable numerical precision. Such decimated signals are bandpass filtered near the respective cutoff frequencies $f_{c1}$, $f_{c2}$, $f_{c3}$, and $f_{c4}$ for estimation stages 40, and once filtered, battery model estimator 24 may perform least squares fits to determine the various primary and secondary parameters, as described above. Further, once the battery impedance model has been established (and which may be dynamically updated over time), battery model estimator 24 may apply such battery impedance model to the monitored battery current $I_{CELL}$ to estimate open circuit voltage $V_{OC}$, voltage $V_{CELL}$-EFF, internal overpotential states of battery 12, a lithium-ion anode potential, and/or other state representing a condition of the battery that may lead to degradation of its chemistry.

Figure 10A:
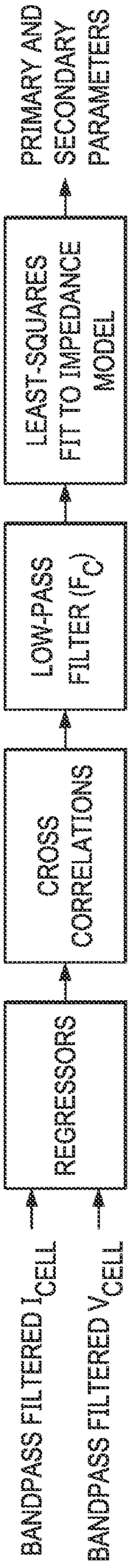
FIG. 10A illustrates a block diagram of a least-squares fit method for estimating primary and second battery model parameters, in accordance with embodiments of the present disclosure.

FIG. 10A illustrates a block diagram of a least-squares fit method for estimating primary and second battery model parameters, in accordance with embodiments of the present disclosure. The least-squares fit method depicted in FIG. 10A may be used to perform the "first estimation step" described for each of estimation stages 40. As shown in FIG. 10A, linear combinations of delayed samples of the decimated, band-pass-filtered measurements of battery voltage $V_{CELL}$ and battery current $I_{CELL}$ may be used to form a set of regressors. A cross-correlation matrix of regressors may be low-pass filtered at the respective cutoff frequency (e.g., $f_{c1}$, $f_{c2}$, $f_{c3}$, $f_{c4}$) for the particular estimation stage 40. Such low-pass filter may comprise a simple accumulate-and-dump filter or a first-order low-pass filter with a bandwidth lower than the lowest cutoff frequency present in the impedance model for such estimation stage 40. Battery model estimator 24 may use the filtered correlations to determine a least-squares fit solution.

Figure 10B:
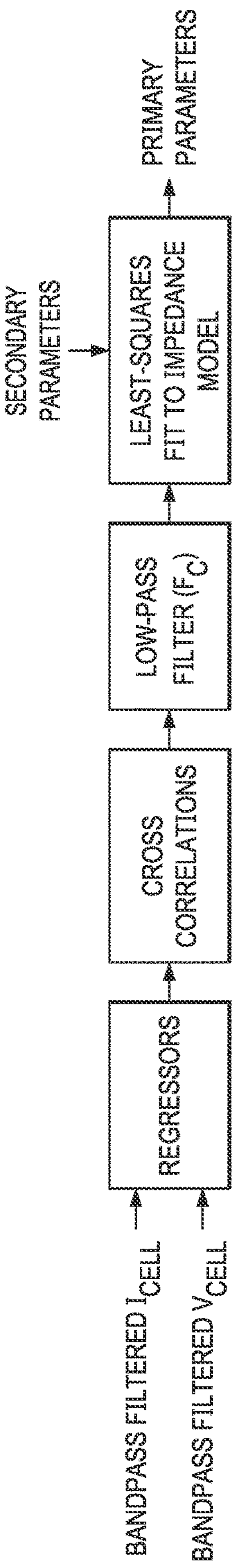
FIG. 10B illustrates a block diagram of a least-squares fit method for estimating primary battery model parameters, in accordance with embodiments of the present disclosure.

FIG. 10B illustrates a block diagram of a least-squares fit method for estimating primary battery model parameters, in accordance with embodiments of the present disclosure. The least-squares fit method depicted in FIG. 10B may be used to perform the "second estimation step" described for each of estimation stages 40. As shown in FIG. 10B, in the second estimation step, the least-squares solution may be further restrained by presetting the secondary parameters to lead to a more accurate estimate of the primary parameters.

In accordance with the foregoing, methods and systems may be provided to estimate parameters of a full battery impedance model that models an output impedance of a battery that powers a load and that is valid over a full range of frequencies of interest. The full battery model may be separated into a number N of separate impedance estimation stages, wherein N is an integer of 2 or greater. Each impedance estimation stage may approximate a full battery impedance model for a limited frequency range. For each of the separate impedance estimation stages, the respective impedance in each stage may include a primary impedance model with a primary set of defining parameters and a secondary impedance model with a secondary set of parameters. The full battery impedance model may be defined by a series connection of all the primary impedance models. Thus, the primary parameters may define the parameters of the full battery model.

A full range of frequencies of interest for the battery model may be from 1 mHz to 10 KHz. Methods and systems disclosed herein may further use measured voltage and current associated with a transient response of the battery under a switching load such as naturally exists in a mobile device. In some embodiments, a broadband test-excitation of the battery may be used to generate such voltage and current.

The primary impedance model of an impedance estimation stage M (wherein M is between 1 and N) may define a main feature (such as an electrical component or the combination of electrical components that define the dominant impedance over that frequency range) of the impedance of the full battery model over a frequency range for the impedance estimation stage M. The secondary impedance model of an impedance estimation stage M (M is between 1 and N) may define a residual feature of the primary impedance model of each impedance estimation stage 1 to M−1 and M+1 to N over the frequency range of the impedance estimation stage M. The secondary impedance model may be a lumped model of impedance of the primary impedance estimation stages 1 to M−1 and M+1 to N.

In accordance with the systems and methods disclosed herein, battery monitoring circuitry may monitor a terminal voltage and terminal current of a battery. For each impedance estimation stage M, the battery monitoring circuitry may band-pass filter the terminal voltage and terminal current in a frequency range associated with such impedance estimation stage M. The battery monitoring circuitry may apply a least-squares fit method to the bandpass-filtered terminal voltage and terminal current measurements to estimate parameters of the full battery impedance model over the impedance estimation stage M.

The least-squares fit method may be performed in two steps. The first estimation step may include estimating the primary and secondary parameters of the impedance estimation stage M; as in the first estimation step, sufficient a priori knowledge of the secondary parameters may not be available in order to perform estimation. The second estimation step may involve presetting the secondary parameters of the impedance estimation stage M and only estimating the primary parameters of the impedance estimation stage M using a least-squares fit method. In some instances, the secondary parameters may become stale and the battery monitoring circuitry may execute the first estimation step and the second estimation step again. In some embodiments, the first parameters step may be performed only once, and the second parameters step may be repeatedly performed (e.g., for tracking parameters).

In some embodiments, the battery monitoring circuitry may constrain some of the estimated parameters based on a priori knowledge of a valid range for the respective parameters. The battery monitoring step may constrain one or more estimated parameters by characterizing a population of samples of the battery.

The battery monitoring circuitry may use a multi-rate implementation wherein, for each impedance estimation stage M, the battery monitoring circuitry uses a sample rate that is sufficient to accurately fit the full battery model over the defined frequency range of such impedance estimation stage M but is low enough to reduce processing requirements of the least-squares fit. In some embodiments, such sample rate may be a sample rate that is at least two times a high cutoff frequency of the bandpass filter of the impedance estimation stage M.

The battery model estimation described herein may be disabled, or its adaptation rate reduced, when a signal-to-noise ratio (SNR) over a frequency band of interest is below a predetermined threshold. Such disabling of battery model estimation or reduction of the adaption rate for estimating parameters may occur if a load powered from a battery is idle or has strong spectral content out of the frequency band of interest. A noise figure required to estimate the SNR over the frequency band may be estimated a priori when the load is absent or a minimal load is detected in the frequency band (that may occur, for instance, when a mobile device is idle). A noise figure may be equally estimated from a voltage and current sensor noise specification and bandpass filter parameters.

Estimation of parameters of an impedance estimation stage M is disabled if content over a frequency band for the impedance estimation stage M is not sufficiently spectrally diverse to estimate the impedance estimation stage M parameters unambiguously (overfit). The spectral condition may be determined by monitoring some terms of a cross-correlation matrix of a least-squares fit.

The full battery impedance model may be implemented with a discrete time infinite impulse response filter, such as a Kalman filter, for example. The full battery impedance model and inferred states may be used for fuel-gauging algorithms or power limits estimation of the battery.

Battery monitoring circuitry may apply the full battery model to a monitored battery voltage and/or battery current to estimate internal states of the full battery model such as overpotentials and an open circuit voltage. In some embodiments, a terminal voltage and terminal current of the battery under a load that is drawing a current from the battery to provide power to the load of the device may be monitored. The battery may be modeled as a battery model that approximates the relationship between the monitored terminal voltage and terminal current over one of the following: (1) a certain frequency range, (2) a certain duration or amplitude range or an applied load, or (3) a set of conditions of the battery or the load, wherein battery monitoring circuitry may be able to estimate a voltage associated with the battery (e.g., open circuit voltage) from the terminal current.

The relationship between the monitored terminal voltage and terminal current may have a frequency dependent characteristic including at least two time constants. The at least two time constants represent a time-varying relationship between an input and an output of a linear or nonlinear model of the battery. As described above, the battery model may have model parameters. The model parameters may be determined through an optimization function. The model parameters and the battery model may be used to predict battery characteristics.

Although the foregoing contemplates battery monitoring circuitry configured to estimate a battery model, in some embodiments, a battery model may be determined in another manner. For example, a battery model may comprise one or more of the following: (1) a linear or non-linear model of the battery, (2) a parameterized equivalent circuit model that models impedance of the battery, (3) a physics-based model, (4) a combination of an equivalent circuit model and a physics-based model, or (5) a Kalman filter or extended Kalman filter. In the case of a parameterized equivalent circuit model, the parameters for modeling an impedance of the battery may include resistive, capacitive and/or inductive circuit elements that may be in parallel or in series and which element impedances may be time varying and/or may have nonlinear characteristics.

A filtered monitored terminal voltage and current may be used to derive an estimated signal-to-noise ratio (SNR) metric or power spectral density (PSD) metric. Parameters of the battery model relevant to the one or more frequency bands may be adapted if sufficient SNR is detected and if the PSD is sufficient to prevent overfitting the battery model. Adaptation of the parameters of the battery model relevant to the one or more frequency bands may be disabled during an idle period or under a constant direct current (DC) load. The adaptation rate of a parameter may be a function of the estimated SNR and of the expected parameter rate of change. A noise figure required for deriving the SNR may be determined when no load or very light load is present such as when the device powered by the battery enters into a sleep mode.

The optimization function may be a least square fit or a frequency or time weighted variant of a least square fit. The battery model may be used in conjunction with a fuel-gauging algorithm. The battery model may be used to estimate a limit of the battery and limit the power drawn from the battery. The battery model may be used to protect the battery from conditions that degrade the battery lifespan. The battery model may be used to design optimized charging or loading conditions of the battery.

A component drawing power from the battery may be a component on a mobile device, such as a central processing unit (CPU), a graphics processing unit (GPU), a power management unit (PMU), an amplifier, an audio, haptic or other actuator, a flash light-emitting-diode (LED), LED screen, a micro-electro-mechanical systems (MEMS) sensor or other sensor, and/or a passive component.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method for estimating parameters of a battery impedance model that models an output impedance of a battery, comprising:

- dividing the battery impedance model into a plurality of separate impedance stages, wherein:
  - each separate impedance stage approximates the battery impedance model within a particular frequency range;
  - a respective impedance model in each separate impedance stage comprises a primary impedance model with a primary set of defining impedance parameters and a secondary impedance model with a secondary set of impedance parameters, wherein the secondary impedance model represents a residual impedance of impedance stages neighboring each impedance stage; and
  - the battery impedance model is defined by a series connection of the respective primary impedance models of the plurality of impedance stages;
- monitoring operation of the battery to determine the primary set of defining impedance parameters and the secondary set of impedance parameters; and
- controlling operation of the battery based on the determined primary set of defining impedance parameters and the secondary set of impedance parameters.

2. The method of claim 1, wherein monitoring operation of the battery comprises monitoring a terminal voltage and a terminal current of the battery associated with a transient response of the battery for powering a load that is drawing a current from the battery to provide power to a component of a device.

3. The method of claim 2, wherein the load is an actual load of a mobile device having components powered from the battery.

4. The method of claim 2, further comprising for each separate impedance stage of the plurality of separate impedance stages, in order to estimate the primary set of defining impedance parameters of the separate impedance stage, band-pass filtering the terminal voltage and the terminal current in a particular frequency range associated with the separate impedance stage.

5. The method of claim 4, wherein:

- band-pass filtering of the terminal voltage and the terminal current forms a sequence; and
- the method further comprises using the sequence to perform a least squares fit to estimate the primary set of defining impedance parameters of the separate impedance stage.

6. The method of claim 5, wherein performing the least squares fit comprises:

- in a first estimation step, estimating the primary set of defining impedance parameters and the secondary set of impedance parameters of the separate impedance stage; and
- in a second estimation step, presetting the secondary set of impedance parameters of the separate impedance stage and estimating only the primary set of defining impedance parameters of the separate impedance stage.

7. The method of claim 6, further comprising:

- performing the first estimation step only once for the separate impedance stage; and
- repeatedly performing the second estimation step to dynamically update the primary set of defining impedance parameters of the separate impedance stage.

8. The method of claim 4, further comprising estimating the primary set of defining impedance parameters of the plurality of separate impedance stages using a multi-rate process wherein, for each separate impedance stage, a sampling rate is used which is sufficient to adequately fit the separate impedance stage of the battery impedance model over the particular frequency range of the separate impedance stage.

9. The method of claim 2, further comprising reducing an adaptation rate of the primary set of defining impedance parameters when a signal-to-noise ratio of either or both of the terminal voltage and the terminal current is below a threshold ratio.

10. The method of claim 1, further comprising reducing an adaptation rate of the primary set of defining impedance parameters when a load of the battery is idle.

11. The method of claim 1, further comprising reducing an adaptation rate of the primary set of defining impedance parameters when a load of the battery has spectral content outside of a frequency band of interest.

12. The method of claim 1, wherein monitoring operation of the battery comprises applying a broadband test excitation to the battery.

13. The method of claim 1, wherein for each of the plurality of separate impedance stages, the primary impedance model for the separate impedance stage defines a main feature of an impedance of the battery impedance model for the particular frequency range of the separate impedance stage.

14. The method of claim 1, wherein determining the primary set of defining impedance parameters and the secondary set of impedance parameters for each separate impedance stage comprises constraining at least one parameter of either or both of the primary set of defining impedance parameters and the secondary set of impedance parameters based on a priori knowledge of the valid range of the respective parameter.

15. The method of claim 14, wherein the constraining is based on characterization of a population of samples of the battery.

16. The method of claim 1, further comprising using the battery impedance model to predict battery characteristics.

17. The method of claim 16, wherein the battery characteristics include at least one of: a maximum available power of the battery, a state of charge of the battery, a state of health of the battery, and an internal state of the battery.

18. The method of claim 17, wherein the internal state may include at least one of an open-circuit voltage of the battery, an internal overpotential states of the battery, a lithium-ion anode potential of the battery, and some other state representing a condition of the battery that may lead to degradation of its chemistry.

19. A system for estimating parameters of a battery impedance model that models an output impedance of a battery, comprising:
- one or more inputs configured to receive information regarding operation of the battery; and
- battery monitoring circuitry configured to:
  - divide the battery impedance model into a plurality of separate impedance stages, wherein:
    - each separate impedance stage approximates the battery impedance model within a particular frequency range;
    - a respective impedance model in each separate impedance stage comprises a primary impedance model with a primary set of defining impedance parameters and a secondary impedance model with a secondary set of impedance parameters, wherein the secondary impedance model represents a residual impedance of impedance stages neighboring each impedance stage; and
    - the battery impedance model is defined by a series connection of the respective primary impedance models of the plurality of impedance stages;
  - monitor operation of the battery to determine the primary set of defining impedance parameters and the secondary set of impedance parameters; and
  - control operation of the battery based on the determined primary set of defining impedance parameters and the secondary set of impedance parameters.

20. The system of claim 19, wherein monitoring operation of the battery comprises monitoring a terminal voltage and a terminal current of the battery associated with a transient response of the battery for powering a load that is drawing a current from the battery to provide power to a component of a device.

21. The system of claim 20, wherein the load is an actual load of a mobile device having components powered from the battery.

22. The system of claim 20, wherein the battery monitoring circuitry is further configured to, for each separate impedance stage of the plurality of separate impedance stages, in order to estimate the primary set of defining impedance parameters of the separate impedance stage, band-pass filter the terminal voltage and the terminal current in a particular frequency range associated with the separate impedance stage.

23. The system of claim 22, wherein:
- band-pass filtering of the terminal voltage and the terminal current forms a sequence; and
- wherein the battery monitoring circuitry is further configured to use the sequence to perform a least squares fit to estimate the primary set of defining impedance parameters of the separate impedance stage.

24. The system of claim 23, wherein performing the least squares fit comprises:
- in a first estimation step, estimating the primary set of defining impedance parameters and the secondary set of impedance parameters of the separate impedance stage; and
- in a second estimation step, presetting the secondary set of impedance parameters of the separate impedance stage and estimating only the primary set of defining impedance parameters of the separate impedance stage.

25. The system of claim 24, wherein the battery monitoring circuitry is further configured to:
- perform the first estimation step only once for the separate impedance stage; and
- repeatedly perform the second estimation step to dynamically update the primary set of defining impedance parameters of the separate impedance stage.

26. The system of claim 22, wherein the battery monitoring circuitry is further configured to estimate the primary set of defining impedance parameters of the plurality of separate impedance stages using a multi-rate process wherein, for each separate impedance stage, a sampling rate is used which is sufficient to adequately fit the separate impedance stage of the battery impedance model over the particular frequency range of the separate impedance stage.

27. The system of claim 20, wherein the battery monitoring circuitry is further configured to reduce an adaptation rate of the primary set of defining impedance parameters when a signal-to-noise ratio of either or both of the terminal voltage and the terminal current is below a threshold ratio.

28. The system of claim 19, wherein the battery monitoring circuitry is further configured to reduce an adaptation rate of the primary set of defining impedance parameters when a load of the battery is idle.

29. The system of claim 19, wherein the battery monitoring circuitry is further configured to reduce an adaptation rate of the primary set of defining impedance parameters when a load of the battery has spectral content outside of a frequency band of interest.

30. The system of claim 19, wherein monitoring operation of the battery comprises applying a broadband test excitation to the battery.

31. The system of claim 19, wherein for each of the plurality of separate impedance stages, the primary impedance model for the separate impedance stage defines a main feature of an impedance of the battery impedance model for the particular frequency range of the separate impedance stage.

32. The system of claim 19, wherein determining the primary set of defining impedance parameters and the secondary set of impedance parameters for each separate impedance stage comprises constraining at least one parameter of either or both of the primary set of defining impedance parameters and the secondary set of impedance parameters based on a priori knowledge of the valid range of the respective parameter.

33. The system of claim 32, wherein the constraining is based on characterization of a population of samples of the battery.

34. The system of claim 19, wherein the battery monitoring circuitry is further configured to use the battery impedance model to predict battery characteristics.

35. The system of claim 34, wherein the battery characteristics include at least one of: a maximum available power of the battery, a state of charge of the battery, a state of health of the battery, and an internal state of the battery.

36. The system of claim 35, wherein the internal state may include at least one of an open-circuit voltage of the battery, an internal overpotential state of the battery, a lithium-ion anode potential of the battery, and some other state representing a condition of the battery that may lead to degradation of its chemistry.

* * * * *